(12) United States Patent
Chen et al.

(10) Patent No.: US 7,470,630 B1
(45) Date of Patent: Dec. 30, 2008

(54) APPROACH TO REDUCE PARASITIC CAPACITANCE FROM DUMMY FILL

(75) Inventors: Shuxian Chen, Fremont, CA (US); Yow-Juang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 207 days.

(21) Appl. No.: 11/107,639

(22) Filed: Apr. 14, 2005

(51) Int. Cl.
*H01L 21/302* (2006.01)
*H01L 21/461* (2006.01)

(52) U.S. Cl. ............... 438/733; 438/735; 438/633; 257/758; 257/752; 257/E21.581

(58) Field of Classification Search ........... 257/758, 257/E27.098; 438/622, 633, 733
See application file for complete search history.

(56) References Cited

U.S. PATENT DOCUMENTS

| | | | | |
|---|---|---|---|---|
| 5,459,093 A * | 10/1995 | Kuroda et al. | ............... | 438/599 |
| 5,604,156 A * | 2/1997 | Chung et al. | ............... | 438/620 |
| 5,741,741 A * | 4/1998 | Tseng | ............... | 438/637 |
| 6,001,733 A * | 12/1999 | Huang et al. | ............... | 438/633 |
| 6,184,121 B1 * | 2/2001 | Buchwalter et al. | ......... | 438/622 |
| 6,319,834 B1 * | 11/2001 | Erb et al. | ............... | 438/687 |
| 6,323,117 B1 * | 11/2001 | Noguchi | ............... | 438/620 |
| 6,436,807 B1 * | 8/2002 | Cwynar et al. | ............... | 438/619 |
| 6,492,259 B2 * | 12/2002 | Dirahoui et al. | ............... | 438/622 |
| 6,627,539 B1 * | 9/2003 | Zhao et al. | ............... | 438/638 |
| 6,717,267 B1 * | 4/2004 | Kunikiyo | ............... | 257/758 |
| 6,961,915 B2 * | 11/2005 | Loh et al. | ............... | 716/9 |
| 7,030,022 B2 * | 4/2006 | Jung et al. | ............... | 438/696 |
| 7,071,009 B2 * | 7/2006 | Wang et al. | ............... | 438/3 |
| 7,163,870 B2 * | 1/2007 | Koubuchi et al. | ............... | 438/424 |
| 7,217,649 B2 * | 5/2007 | Bailey et al. | ............... | 438/622 |
| 2001/0027008 A1 * | 10/2001 | Matsumoto | ............... | 438/618 |
| 2002/0110759 A1 * | 8/2002 | Lin et al. | ............... | 430/321 |
| 2002/0167072 A1 * | 11/2002 | Andosca | ............... | 257/620 |
| 2003/0027425 A1 * | 2/2003 | Kawanishi | ............... | 438/699 |
| 2003/0151080 A1 * | 8/2003 | Hurley et al. | ............... | 257/296 |
| 2004/0023499 A1 * | 2/2004 | Hellig et al. | ............... | 438/694 |
| 2004/0029385 A1 * | 2/2004 | Manger et al. | ............... | 438/689 |
| 2004/0053505 A1 * | 3/2004 | Chin et al. | ............... | 438/710 |
| 2004/0058508 A1 * | 3/2004 | Parat et al. | ............... | 438/424 |
| 2004/0084777 A1 * | 5/2004 | Yamanoue et al. | ............... | 257/758 |
| 2004/0089924 A1 * | 5/2004 | Yuasa et al. | ............... | 257/673 |
| 2004/0092115 A1 * | 5/2004 | Hsieh et al. | ............... | 438/694 |
| 2005/0170661 A1 * | 8/2005 | Economikos et al. | ........ | 438/759 |
| 2006/0197228 A1 * | 9/2006 | Daubenspeck et al. | ...... | 257/773 |

* cited by examiner

*Primary Examiner*—Marcos D. Pizarro
*Assistant Examiner*—Igwe U. Anya
(74) *Attorney, Agent, or Firm*—Morgan, Lewis & Bockius LLP

(57) ABSTRACT

An integrated circuit includes a semiconductor substrate and multiple dielectric layers stacked on the substrate. Multiple interconnect metal lines and dummy metals are embedded in the dielectric layers. At least one of the dummy metals is substantially thinner than the interconnect metal lines. To form this structure, first and second pluralities of trenches are formed in the dielectric layer. At least one of the second plurality of trenches is shallower than the first plurality of trenches. The first and second pluralities of trenches are filled with a conductive layer and then planarized.

7 Claims, 6 Drawing Sheets

(a)

(b)

Top View (a)

Cross-sectional View After Etching (b)

Cross-sectional View After Polishing (c)

APPROACH TO REDUCE PARASITIC CAPACITANCE FROM DUMMY FILL

FIELD OF THE INVENTION

The present invention relates generally to the field of integrated circuit (IC) manufacture, and in particular to methods for reducing parasitic capacitance caused by dummy metals embedded in a semiconductor substrate.

CROSS-REFERENCE TO RELATED APPLICATIONS

A related application is "Structure to Measure Both Interconnect Resistance and Capacitance", Ser. No. 10/759,400, filed Jan. 16, 2004 which is incorporated herein by reference.

BACKGROUND

Low resistivity metals like copper and low permittivity (low-k) dielectric materials are widely used in IC manufacture to improve a circuit's performance. FIG. 1 of the above-referenced patent application illustrates the major steps of forming copper interconnects in a layer of low-k dielectric material (e.g., SiOC-based) which is on top of the surface of a semiconductor substrate. One of the steps is chemical-mechanical planarization (CMP), a process using an abrasive, corrosive slurry to planarize the surface of the copper interconnects and the dielectric layer. The copper interconnnects left in the trenches in the dielectric layer are responsible for transmitting signals into and out of the circuit.

Due to the difference in hardness between the dielectric material and copper, CMP often causes a dishing effect on the top surface of a copper interconnect in which the top surface becomes concave. Moreover, two copper interconnects having same or the similar dimensional parameters (e.g., width and thickness) may have significantly different dishing effects and therefore different cross-sectional areas depending upon their respective locations and surrounding environments in the dielectric layer. This variation in cross-sectional area may lead to a variation in sheet resistance and parasitic capacitance from one interconnect to another, which may have an adverse impact on the performance of the circuit.

FIGS. 1(a) and 1(b) are a cross-sectional view and a top view of a structure in which the uniformity of dishing effect is improved by inserting metal regions between interconnect metal lines in different dielectric layers that are stacked on a semiconductor substrate. Following the practice in the art, these regions will be referred hereinafter as "dummy metals". The cross-sectional view depicts three dielectric layers A, B and C stacked one on top of the other above a semiconductor substrate (not shown), each layer having multiple interconnect metal lines such as ground ("Gnd") and signal ("Sgn") lines. To reduce the variation in dishing effect, multiple dummy metals identified as FIGS. 1(a) and 1(b) as "Dummy" are filled into the dielectric layers, such that each dielectric layer has a substantially uniform metal density. Because each layer has substantially uniform metal density, different interconnect metal lines have similar cross-sectional areas and therefore similar sheet resistances after CMP. The top view of layer B illustrates this uniform metal density within layer B after filling the dummy metals.

Unfortunately, there is a side effect associated with the insertion of dummy metals in the dielectric layers. Referring again to FIG. 1, the inter-layer distance S1 between an interconnect metal line and a dummy metal is small due to the presence of dummy metals in the dielectric layers. This small inter-layer distance causes a significant amount of parasitic capacitance in the circuit, which may seriously limit the performance of the circuit. In view of the discussions above, there is a need to reduce the parasitic capacitance caused by dummy metals in the dielectric layers.

SUMMARY

In a preferred embodiment of the method of the invention, first and second pluralities of trenches are formed in the dielectric layer on top of a semiconductor substrate. At least one of the second plurality of trenches is substantially shallower than the first plurality of trenches. The first and second pluralities of trenches are then filled with a conductive layer and the conductive layer and the dielectric layer are planarized. Consequently, a set of interconnect metal lines is formed in the first plurality of trenches in which the interconnect metal lines are thicker than the dummy metals formed in the second plurality of trenches.

An integrated circuit of the present invention includes a semiconductor substrate and multiple dielectric layers stacked on the substrate. Multiple interconnect metal lines and dummy metals are embedded in the dielectric layers. In a preferred embodiment, at least one of the dummy metals is substantially thinner than the interconnect metal lines.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings. Like reference numerals refer to corresponding parts throughout the several views of the drawings.

DESCRIPTION OF EMBODIMENTS

Figure 1:
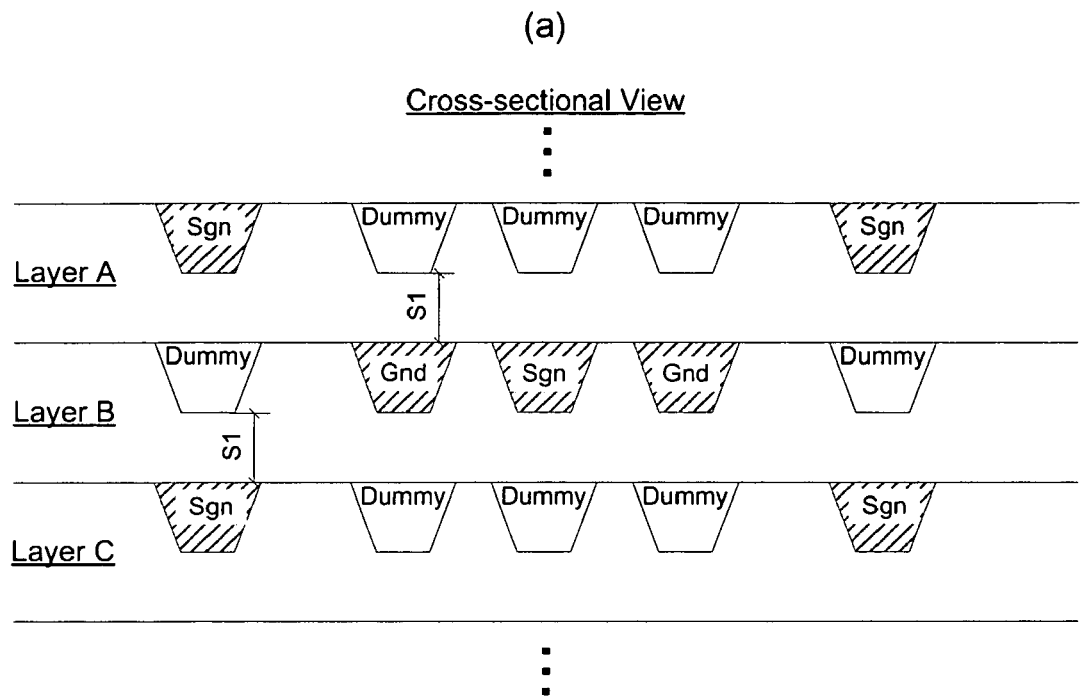
FIGS. 1(a) and 1(b) are a cross-sectional view and a top view illustrating a prior art structure for improving the uniformity of dishing effect by inserting dummy metals into dielectric layers stacked on top of a semiconductor substrate.
Figure 1:
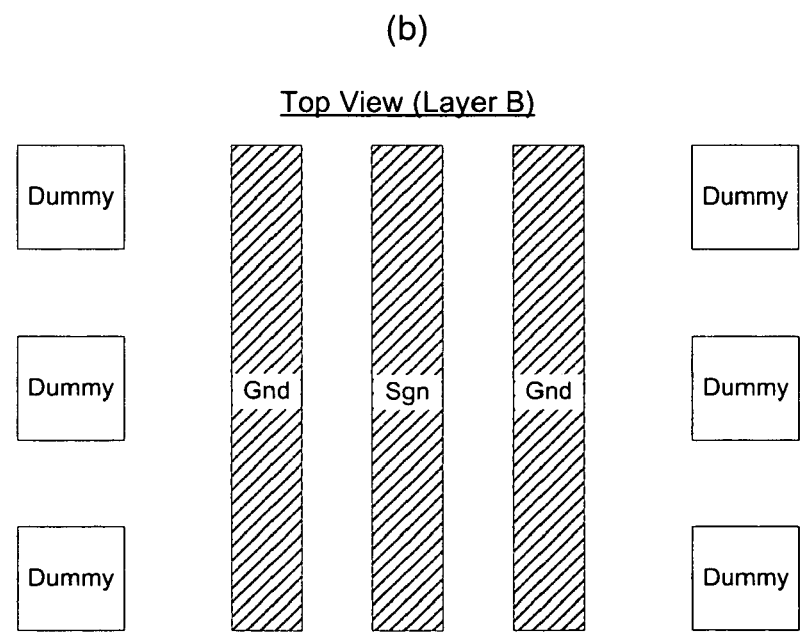
Figure 2:
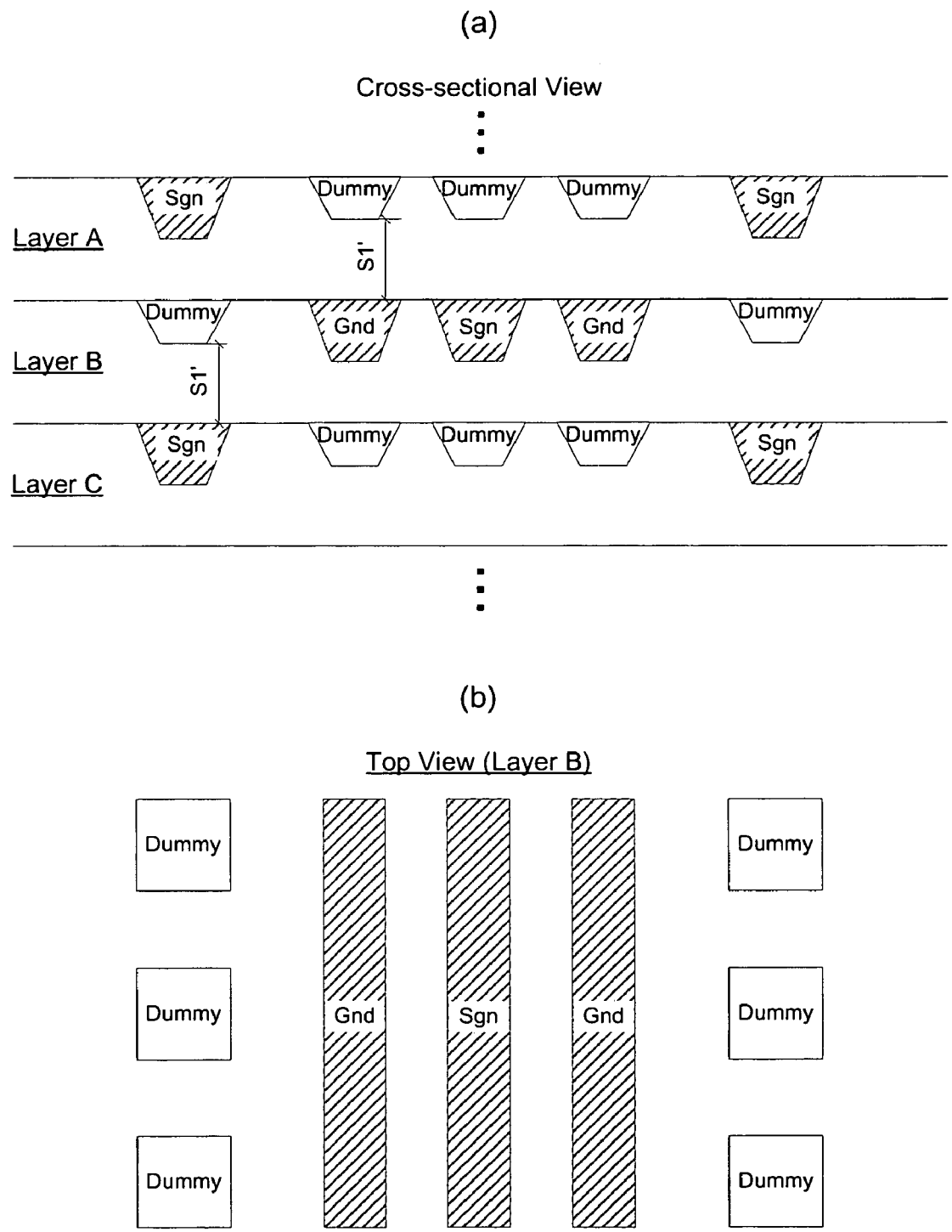
FIGS. 2(a) and 2(b) are a cross-sectional view and a top view illustrating a structure for reducing parasitic capacitance caused by dummy metals in the dielectric layers in accordance with some embodiments of the present invention.

FIGS. 2(a) and 2(b) are a cross-sectional view and a top view of a structure for reducing parasitic capacitance caused by dummy metals in the dielectric layers stacked on a substrate surface in accordance with some embodiments of the present invention. The dummy metals are electrically insulated from the interconnect metal lines, which are electrically connected to at least one semiconductor component in the substrate. The circuit structure shown in FIGS. 2(a) and 2(b)

is similar to that in FIGS. 1(a) and 1(b) except that the dummy metals in FIGS. 2(a) and 2(b) are thinner than the interconnect metal lines. Accordingly, the inter-layer distance S1' between an interconnect metal line and a dummy metal is larger than the corresponding inter-layer distance S1 shown in FIG. 1(a). An increase of the inter-layer distance reduces the inter-layer parasitic capacitance between the interconnect metal line and the dummy metal. Thinner dummy metals can also reduce the intra-layer parasitic capacitance between the dummy metals and its adjacent interconnect metal lines because the projected area of the dummy metal on the interconnect metal line is smaller.

Advantageously, the layout of the dummy metals and the interconnect lines in FIG. 2(b) can be the same as in FIG. 1(b) so that the top view of layer B in FIG. 2(b) is essentially the same as the top view in FIG. 1(b). As a result, the insertion of thinner dummy metals can maintain the uniformity of metal density distribution across the surface of the dielectric layer. Thus, when the layout of FIG. 2(b) is subjected to CMP, the process is performed on a surface having a substantially uniform metal density just as in the case of the structure of FIG. 1(b) and there is no substantial variation in dishing effect associated with the interconnect metal lines shown in FIG. 2(b). In particular, the interconnect metal lines all have similar cross-sectional areas and therefore similar sheet resistances.

One way to increase the inter-layer distance between an interconnect metal line and a dummy metal is to make a trench hosting the dummy metal shallower than the trenches hosting regular interconnect metal lines. FIGS. 3(a)-(f), 4(a)-(d) and 5(a)-(b) depict three embodiments of the invention for creating trenches of different depths in a dielectric layer to form dummy metals that are thinner than interconnect metal lines in the dielectric layer A of FIG. 2(a).

Figure 3:
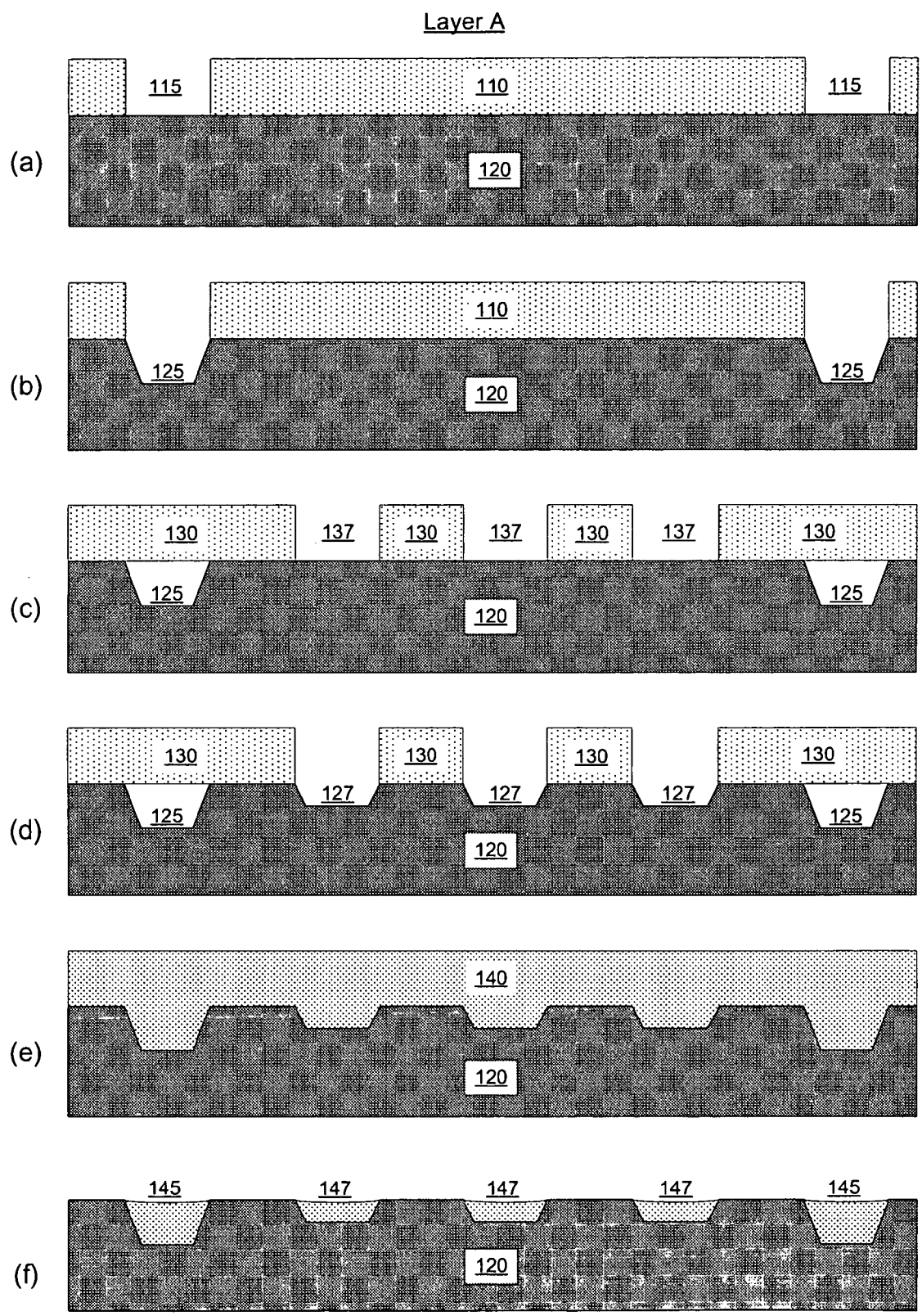
FIGS. 3(a)-3(f) are block diagrams illustrating a first embodiment of the present invention of forming dummy metals that are thinner than interconnect metal lines in a dielectric layer.

As shown in FIG. 3(a), a photoresist mask 110 is formed on the surface of a dielectric layer 120 using known techniques (e.g., photolithography). The mask 110 includes multiple openings 115, each opening exposing a portion of the underlying dielectric layer 120 where a trench is to be created for hosting an interconnect metal line. Subsequently, as shown in FIG. 3(b), the dielectric material at the exposed locations on the dielectric layer 120 is etched away using a suitable etchant for a predetermined time period, leaving a first set of trenches 125 having a first depth in the dielectric layer 120.

As shown in FIG. 3(c), another photoresist mask 130 is then formed on the dielectric layer 120. This mask 130 covers the previously created trenches 125 and has openings 137 exposing another set of locations on the dielectric layer 120. As shown in FIG. 3(d), another etching process is performed using a suitable etchant for a predetermined time period to remove dielectric material at those locations, which creates a second set of trenches 127 in the dielectric layer 120 for hosting dummy metals. Note that the two predetermined time periods and the two etchants are chosen such that the trenches 127 created by the second etching process are shallower than those created by the first etching process. In some embodiments, the two etchants used in the two etching processes are the same.

The effects of the invention will be observed for any reduction in the depth of the trenches that host the dummy metals. In some embodiments, the depth of the second set of trenches is only 50% of the depth of the first set of trenches. In such embodiments, the parasitic capacitance caused by dummy metals can be reduced by at least 10%. Even greater reductions in parasitic capacitance can be achieved for greater reductions in the depth of the trenches hosting the dummy metals up to the limits set by the process used to form the metal interconnect lines and dummy regions. In some embodiments, the depth of the trenches hosting the dummy metals is as small as only 30% of the depth of the trenches hosting the interconnect metal lines.

Next, as shown in FIG. 3(e), a copper layer 140 is deposited on the surface of the dielectric layer 120. A subsequent CMP process removes a portion of the copper layer, leaving a set of interconnect metal lines 145 and a set of dummy metals 147 in the trenches 125 and 127, respectively, as shown in FIG. 3(f). Because the trenches 125 are deeper than the trenches 127, the interconnect metal lines 145 are thicker than the dummy metals 147. However, as shown by the last diagram in FIG. 3(f), the two sets of metal lines have similar dishing effects since the two sets of metals are uniformly distributed on the surface of the dielectric layer 120.

Alternatively, the photoresist mask 130 is first used for creating a set of trenches 127 to host the dummy metals. Next, the photoresist mask 110 is used for creating a set of trenches 125 to host the interconnect metal lines.

Figure 4:
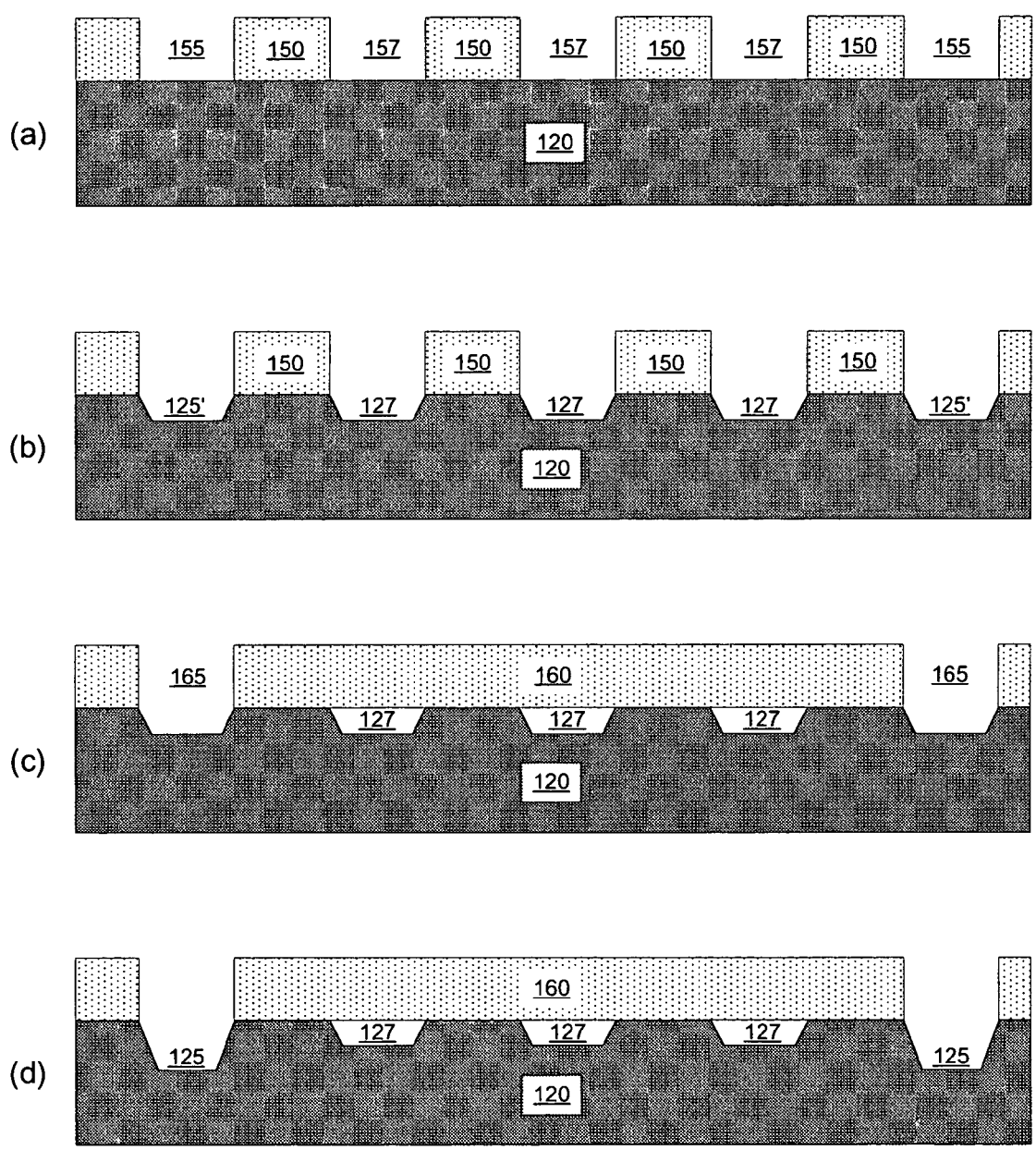
FIGS. 4(a)-4(d) are diagrams illustrating a second embodiment of the present invention of forming dummy metals that are thinner than interconnect metal lines in a dielectric layer.

In a second embodiment shown in FIGS. 4(a)-4(d), a photoresist mask 150 is formed on the surface of the dielectric layer 120. The mask 150 includes two sets of openings 155 and 157. The openings 155 expose locations on the dielectric layer 120 where the interconnect metal lines are to be formed, while the openings 157 expose locations where the dummy metals are to be located. An etching process first etches the exposed dielectric layer for a predetermined time period to create two sets of trenches 125' and 127 as shown in FIG. 4(b). All the trenches have the same depth, which corresponds to the desired thickness of the dummy metals.

Next, a photoresist mask 160 is formed on the dielectric layer 120 as shown in FIG. 4(c). In some embodiments, this mask is the same as the mask 110 shown in FIG. 3(a). It covers the trenches 127 and exposes the trenches 125', which are further etched a shown in FIG. 4(d) by an etchant for another predetermined time period to create the trenches 125 for hosting interconnect metal lines. After that, the same set of processes such as copper deposition and CMP discussed above in connection with FIGS. 3(e) and 3(f) are employed to form interconnect metal lines 145 and dummy metals 147 in the two sets of trenches.

Both the aforementioned two embodiments require the formation of two photoresist masks on the dielectric layer to create two sets of trenches having different depths. In contrast, the third embodiment discussed below needs only one photoresist mask.

As shown in FIG. 5(a), a photoresist mask 170 includes two sets of openings 175 and 177. Openings 175 expose a portion of the dielectric layer for hosting interconnect metal lines and openings 177 expose a portion of the dielectric layer for hosting dummy metals. Note that each opening 177 includes multiple sub-openings. A more detailed discussion of the sub-openings is provided below in conjunction with FIG. 6.

Because of the sub-openings associated with the openings 177, the etching rate at the openings 177 is lower than that at the openings 175; and after being etched by an etchant for a predetermined time period, the trenches 125 are deeper than the trenches 127 as shown in FIG. 5(b). Therefore, the interconnect metal lines formed in the trenches 125 are thicker than the dummy metals formed in the trenches 127.

Figure 5:
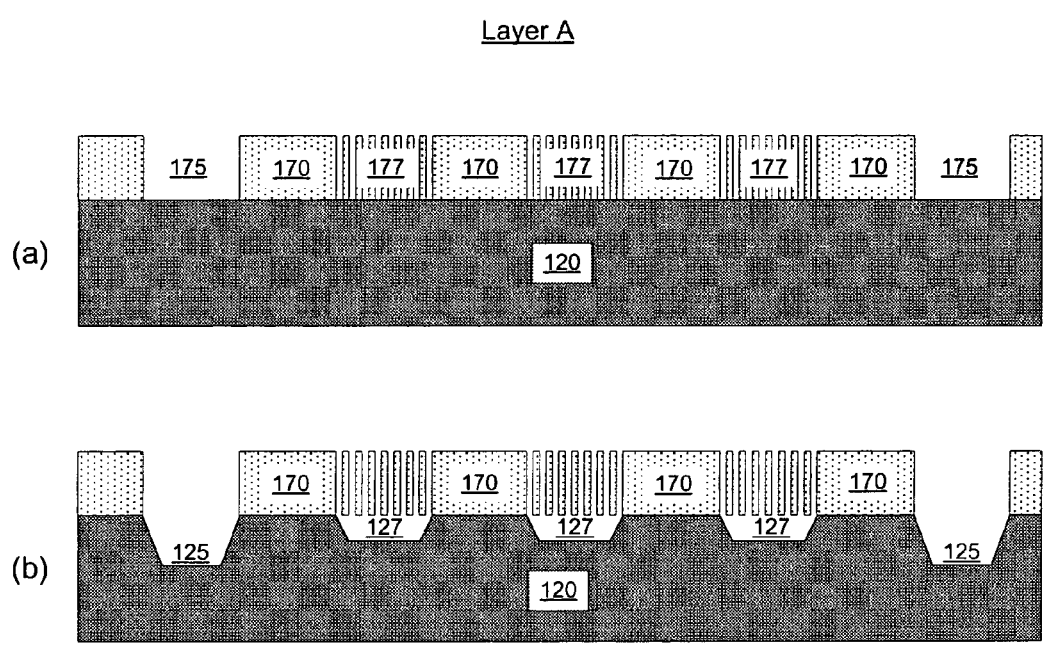
FIGS. 5(a) and 5(b) are block diagrams illustrating a third embodiment of the present invention of forming dummy metals that are thinner than interconnect metal lines in a dielectric layer.
Figure 6:
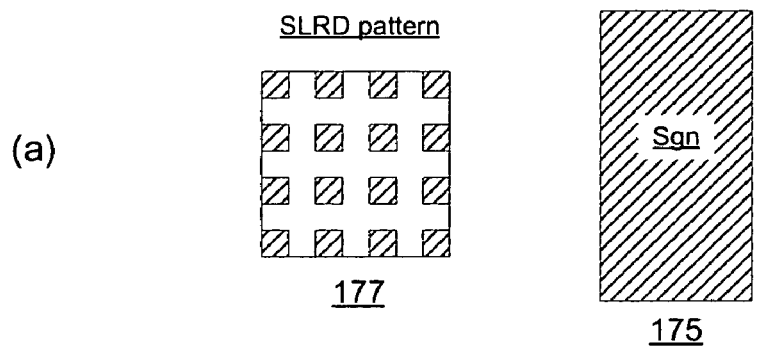
FIGS. 6(a)-6(c) are block diagrams illustrating an etching scheme applicable to the third embodiment of the present invention.
Figure 6:
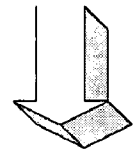
Figure 6:
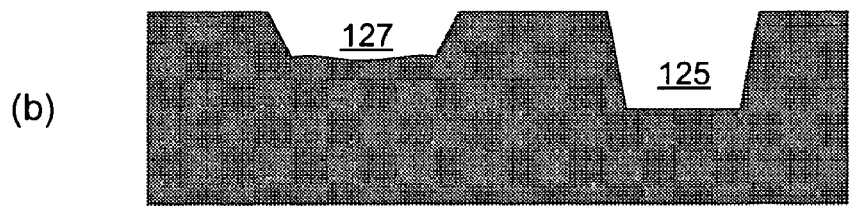
Figure 6:
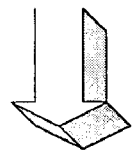
Figure 6:
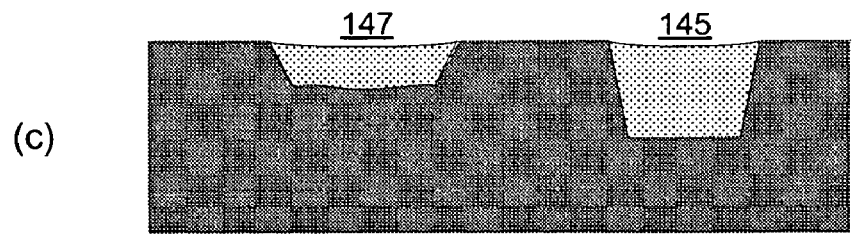

FIG. 6(a) provides enlarged views of a pair of openings 177 and 175 shown in FIG. 5. Opening 177 includes multiple sub-openings 178 that form a sub-lithography resolution dummy (SLRD) pattern. In embodiments where etching is performed by a plasma etching, the optical diffraction effect caused by this SLRD pattern reduces the interaction between the etchant and the dielectric layer with the result that the etching rate at opening 177 is lower than that at opening 175. The cross-sectional view of FIG. 6(*b*) further depicts that, after the etching process, the two trenches 127 and 125 have different depths. The cross-sectional view of FIG. 6(*c*) illustrates a dummy metal 147 and an interconnect metal line 145 having different thicknesses after copper deposition and CMP.

As the critical dimension and thickness of the dielectric layers of an integrated circuit continues to diminish, the parasitic capacitance caused by dummy metals is an increasingly important issue affecting the circuit's performance. This issue is even more critical in an analog IC because it is more sensitive to the variation in interconnect sheet resistance and parasitic capacitance. It is therefore apparent to one skilled in the art that the present invention will become more valuable with the advance of semiconductor processing technology.

The foregoing description, for purpose of explanation, has been set forth with reference to specific embodiments. However, the illustrative discussions above are not intended to be exhaustive or to limit the invention to the precise forms disclosed. While some reordering or other groupings are specifically mentioned above, others will be obvious to one of ordinary skill in the art and so do not present an exhaustive list of alternatives.

What is claimed is:

1. A method of forming conductive lines in a first dielectric layer on top of a second dielectric layer on a semiconductor substrate, comprising:
    forming a mask on the first dielectric layer, the mask exposing a first set and a second set of locations on the first dielectric layer to an etchant, the mask including structure in regions adjacent one set of locations such that there are different etching rates at the first and second sets of locations;
    forming a first plurality of trenches at the first set of locations in the first dielectric layer;
    forming a second plurality of trenches at the second set of locations in the first dielectric layer, the second plurality of trenches being shallower than the first plurality of trenches and located over a interconnect metal line in the second dielectric layer;
    forming a plurality of interconnect metal lines in the first plurality of trenches;
    forming a plurality of dummy metals in the second plurality of trenches; and
    planarizing the plurality of interconnect metal lines and the plurality of dummy metals with the first dielectric layer so that at least one dummy metal is formed in the first dielectric layer that is thinner than the interconnect metal lines and has a distance to an interconnect metal line in the second dielectric layer that is greater than it otherwise would be, thereby reducing parasitic capacitance.

2. The method of claim 1, wherein the plurality of interconnect metal lines and the plurality of dummy metals are made of copper.

3. The method of claim 1, wherein the dummy metals and the interconnect metal lines within one of the dielectric layers are distributed so that the dielectric layer has a substantially uniform metal density across a surface of an integrated circuit formed in the substrate.

4. The method of claim 1, wherein two interconnect metal lines having a similar width within the dielectric layer have a substantially similar thickness irrespective of their locations in the dielectric layer.

5. The method of claim 1, wherein at least one of the interconnect metal lines is electrically connected to at least one semiconductor component in the substrate.

6. The method of claim 1, wherein the dummy metals are electrically insulated from the interconnect metal lines.

7. The method of claim 1, wherein the etching rate at the second set of locations is lower than that at the first set of locations.

* * * * *